United States Patent
Mizuta

[19]

[11] Patent Number: 6,144,212

[45] Date of Patent: Nov. 7, 2000

[54] VERTICAL NEEDLE TYPE PROBE CARD, METHOD OF MANUFACTURING THEREOF, METHOD OF REPLACING DEFECTIVE PROBE NEEDLE AND TEST METHOD OF WAFER USING THE PROBE CARD

[75] Inventor: Masaharu Mizuta, Hyogo, Japan

[73] Assignee: Mitsubishi Denki Kabushiki Kaisha, Tokyo, Japan

[21] Appl. No.: 09/055,778

[22] Filed: Apr. 7, 1998

[30] Foreign Application Priority Data

Oct. 21, 1997 [JP] Japan .................................. 9-288356

[51] Int. Cl.⁷ .................................................. G01R 31/02
[52] U.S. Cl. ............................. 324/754; 324/758; 324/761
[58] Field of Search .................................. 324/754, 755, 324/756, 757, 758, 761, 765

[56] References Cited

U.S. PATENT DOCUMENTS

| | | | |
|---|---|---|---|
| 3,911,361 | 10/1975 | Bove et al. | 324/761 |
| 5,225,777 | 7/1993 | Bross et al. | 324/754 |
| 5,325,052 | 6/1994 | Yamashita | 324/754 |
| 5,440,240 | 8/1995 | Wood et al. | 324/765 |
| 5,477,160 | 12/1995 | Love | 324/755 |
| 5,850,148 | 12/1998 | Nam | 324/761 |
| 5,952,843 | 9/1999 | Vinh | 324/761 |

FOREIGN PATENT DOCUMENTS

| | | |
|---|---|---|
| 57-146340 | 9/1982 | Japan . |
| 63-71659 | 4/1988 | Japan . |
| 63-208237 | 8/1988 | Japan . |

OTHER PUBLICATIONS

Nikkei Microdevices, Sep. 1996, pp. 101–106.

Primary Examiner—Safet Metjahic
Assistant Examiner—T. R. Sundaram
Attorney, Agent, or Firm—McDermott, Will & Emery

[57] ABSTRACT

A main object of the present invention is to provide a vertical needle type probe card which is improved so that necessary needle pressure is obtained even if variation of the probe needles in the height direction is larger to some extent. The upper portion of a probe needle is supported by an upper guide plate. The lower portion of probe needle is supported by a lower guide plate. Upper portion of probe needle is bent into an L shape. A conductive rubber sheet and a printed wiring board are provided on upper guide plate.

11 Claims, 10 Drawing Sheets

VERTICAL NEEDLE TYPE PROBE CARD, METHOD OF MANUFACTURING THEREOF, METHOD OF REPLACING DEFECTIVE PROBE NEEDLE AND TEST METHOD OF WAFER USING THE PROBE CARD

BACKGROUND OF THE INVENTION

1. Field of the Invention

The present invention relates generally to a vertical needle type probe card and more particularly to an improved vertical needle type probe card which can be manufactured at low cost and allow a shorter test time. The present invention also relates to a method of manufacturing such a vertical needle type probe card. Further, the present invention relates to a method of replacing a defective probe needle of the vertical needle type probe card. The present invention also relates to a test method of a wafer using the probe card.

2. Description of the Background Art

In manufacturing an IC, an LSI or the like, a plurality of wafer chips are generally produced on one board. Before these wafer chips are cut on a chip basis, a wafer test is carried out to check whether an individual chip is defective or not. In such a wafer test, a device called a prober is usually connected to a probe card, and a probe needle of the probe card comes into contact with a prescribed electrode (pad) of a semiconductor chip. After the probe needle comes into contact with the semiconductor chip, constant pressure (called needle pressure) is applied between the probe needle and the pad (this operation is called an overdrive). As a result of the overdrive, the probe needle is slid and moved on the pad surface, removing aluminum oxide of the pad surface. Thus, aluminum under aluminum oxide is electrically connected to the probe needle.

FIG. 24 is a cross sectional view of a probe card using a conventional cantilever type probe needle disclosed in Japanese Utility Model Laying-Open No. 57-146340. The probe card includes one printed wiring board 1 (hereinafter referred to as a board). An opening 2 is provided in the center of board 1. A plurality of probe needles 3 are radially provided at the lower surface of board 1 so that their tips reach prescribed positions in opening 2. The base of probe needle 3 and a contact portion for connecting a connector (not shown) provided at the end of board 1 are connected by a printed wiring or wire.

FIG. 25 shows the relationship between the displacement of the cantilever type probe needle and a force (F). In this specification, the probe needle displacement denotes the height of the tip of probe needle 3 from the lower surface of board 1, as shown in FIG. 26. In this specification, the force (F) denotes needle pressure (F) which is applied to probe needle 3 in its height direction at the time of the overdrive.

Referring to FIG. 25, a linear relationship is formed by the displacement of the probe needle and the force. In general, the overdrive of approximately 100 $\mu$m applies the needle pressure of approximately a few grams (for example, 7 g) to probe needle 3. Thus, the pad and probe needle 3 are electrically connected to perform the wafer test.

The relative positions of probe needle 3 and the pad are essential in each of longitudinal, lateral and height directions. For each direction, the precision of approximately ±10 $\mu$m is required. A high density IC which will be developed from now on should demand a much stricter precision. At present, the relative positions of the probe needle and the pad are adjusted by hand. In this case, it is difficult to adjust the height of the probe needle (distance of the tip of the probe needle from the lower surface of the board).

In order to test a memory IC, a method called a simultaneous test is usually employed to simultaneously test a plurality of memory IC chips on a wafer. In the simultaneous test, probe needles usually come into contact with a total of 2×8=16 pads. In short, referring to FIG. 24, one row of the cantilever type probe needles comes into contact with 1 row×8 ICs and another row of the probe needles comes into contact with 1 row×8 ICs, with a total of 2×8 memory IC chips tested simultaneously by the probe needles on the both sides.

It is assumed here that one wafer has such number and arrangement of IC chips that the tests of all the IC chips are completed after 20 times of the 2×8 simultaneous tests. In this case, the numbers of the 4×4 simultaneous tests and the 4×8 simultaneous tests are smaller than the 2×8 simultaneous tests, as described below.

In the case of the 2×8 simultaneous test, 20 times/wafer in the case of the 4×4 simultaneous test, 15 times/wafer (−25%)

in the case of the 4×8 simultaneous test, 10 times/wafer (−50%)

The more the number of chips to be tested simultaneously as in the case of 4×8=32 chips, the smaller the number of the test times. For the same number of the simultaneous tests, the test numbers are smaller in the 4×4 test than in the 2×8 test. It can be understood considering the arrangement of a plurality of memory IC chips on one wafer.

The smaller number of the test times means a shorter test time per wafer. The data above indicates that reduction of the test time by 25% or 50% is possible simply through modification of the probe card structure.

With the reduction of the test time, the time for the test process is shortened and therefore quick delivery of products becomes possible. Further, production is increased by 25% or 50% with the same number of the testers. Therefore, it is a great task for those of who carry out the wafer tests to increase the number of chips to be tested simultaneously by a probe card.

Both of the 2×8 structure and the 4×4 structure which allow the simultaneous test of 16 chips do not require modification of the tester. Therefore, the 4×4 structure which allows a shorter test time should have been realized by now. However, the 4×4 structure in which two stages of the cantilever type probe needles are placed on both sides as shown in FIG. 27 has not been realized. Although this type of the 4×4 structure can be manufactured in principle, maintenance such as adjustment of longitudinal, lateral and height positions and repair after each test is very complicated and difficult, resulting in the maintenance cost per needle several times higher.

For example, the difficulty of adjustment would be readily understood if the precision of the probe needle is indicated by numerical values. The probe needle specification is as follows.

tip diameter of the probe needle: about 30 $\mu$m$\phi$ pitch of the probe needle: about 100 $\mu$m number of the probe needle: about 300 pieces/row positional precision of the probe needle: about ±10 $\mu$m In short, in the case of the 4×4 simultaneous test, there are about 300 needles in one row. Let us consider the two inner rows of the probe needles which are longer with reference to FIG. 27. In this case, it is very difficult to adjust the longitudinal, lateral and height positions of the probe needle so that the positional precision of the tip of the probe needle is always about ±10 $\mu$m. In this present situation, therefore, the 2×8 simultaneous test method is employed by the probe card which has only the two outer rows.

In recent years, the degree of integration has greatly be improved from 16 M to 64 M and to 256 M especially in a DRAM memory IC, and it causes a longer test time which is an obstacle in the IC production line. Therefore, reduction in the test time is immediately required.

The structures such as 4×4, 4×8 and n (at least 4)×m which are effective in reducing the test time have been studied for practical use by introducing a probe card (hereinafter referred to as a vertical needle type probe card) which uses a probe needle called a vertical needle.

FIG. 28 is a cross sectional view of a conventional vertical needle type probe card described in *NIKKEI MICRODEVICES*, September 1996, pp. 101–106. Referring to FIG. 28, a pin 4 is arranged in a vertical direction through a hole in a guide plate 6. The end of pin 4 is arranged in an arbitrary manner. A wafer is vertically moved from below toward above to contact pin 4. Since pin 4 functions as a spring, a load is applied to the pin end when the pin is retrieved. Since the conventional vertical needle type probe card has been described to this extent, its structure and the method of manufacturing thereof are not well known.

SUMMARY OF THE INVENTION

Therefore, an object of the present invention is to provide a vertical needle type probe card which facilitates provision of the structures such as 4×4, 4×8 and n (at least 4)×m.

Another object of the present invention is to provide an improved vertical needle type probe card which can be manufactured easily and at low cost.

Yet another object of the present invention is to provide an improved vertical needle type probe card which allows a shorter test time.

Yet another object of the present invention is to provide an improved vertical needle type probe card which allows reduction in test cost.

Another object of the present invention is to provide a vertical needle type probe card which allows cheap ICs to users.

Yet another object of the present invention is to provide a method of manufacturing such a vertical needle type probe card.

A further object of the present invention is to provide a method of replacing a defective probe needle of the vertical needle type probe type.

A further object of the present invention is to provide a test method of a wafer using the probe card.

A vertical needle type probe card according to a first aspect of the present invention is adapted to transfer an electric signal from an IC to a tester by bringing the lower portion of a probe needle vertically in contact with an IC pad. The vertical needle type probe card includes a probe needle having upper and lower portions and an intermediate portion connecting them. The upper portion of the probe needle penetrates an upper guide plate. The upper guide plate supports the upper portion of the probe needle. A lower guide plate is provided under the upper guide plate. The lower portion of the probe needle penetrates the lower guide plate. The lower guide plate supports the lower portion of the probe needle. A conductive rubber sheet is provided on the upper guide plate. A printed wiring board is provided on the conductive rubber sheet. In the conductive rubber sheet, a conductive path is provided which electrically connects the upper portion of the probe needle to the printed wiring board so as to transfer the electric signal from the IC to the tester.

According to a vertical needle type probe card of a second aspect, the intermediate portion of the probe needle is finer than the upper and lower portions, and the upper portion of the probe needle is bent into an L shape to have vertical and horizontal portions.

According to a vertical needle type probe card of a third aspect, the intermediate portion of the probe needle has a rectangular sectional shape.

According to a vertical needle type probe card of a fourth aspect, the probe needle is formed by bending a plate-like member.

According to a vertical needle type probe card of a fifth aspect, the upper guide plate has a hole for passing the upper portion of the probe needle therethrough, and a groove provided at the surface of the plate to be connected to the hole for fixing the horizontal portion of the probe needle which is fit therein.

According to a vertical needle type probe card of a sixth aspect, the upper and lower guide plates are spaced apart by a prescribed distance to expose the intermediate portion of the probe needle, and the upper and lower guide plates are horizontally displaced to curve the intermediate portion of the probe needle.

According to a vertical needle type probe card of a seventh aspect, one end of the conductive path is in contact with the surface of the horizontal portion of the probe needle.

According to a vertical needle type probe card of a eighth aspect, the upper and lower guide plates are formed of the same material as a wafer on which an IC chip to be wafer-tested is formed.

According to a vertical needle type probe card of a ninth aspect, the upper and lower guide plates are formed of mica-based ceramics having superior processability.

According to a method of manufacturing a vertical needle type probe card of a tenth aspect, the lower portion of the probe needle is vertically in contact with an IC pad, and an electric signal from the IC is transferred to a tester. First, a probe needle is prepared which has upper and lower portions and an intermediate portion connecting them, with its upper portion bent into an L shape to form vertical and horizontal portions. Then, an upper guide plate is prepared which has a first through hole for passing the probe needle therethrough, and a groove formed at the surface so that the vertical portion of the probe needle is fit in the groove. A lower guide plate is prepared which has a second through hole for passing the probe needle therethrough. The upper guide plate is placed on the lower guide plate so that the first and second through holes are aligned vertically. A probe needle is inserted into the first and second through holes until the horizontal portion is fit in the groove. The upper and lower guide plates are separated to expose the intermediate portion of the probe needle. The upper and lower guide plates are horizontally displaced to curve the intermediate portion of the probe needle. A conductive rubber sheet is formed on the upper guide plate. A printed wiring board is formed on the conductive rubber sheet. The conductive rubber sheet is compressed by the upper guide plate and the printed wiring board. In the conductive rubber sheet, a conductive path is formed which has one end connected to the printed wiring board and the other end electrically connected to the horizontal portion of the probe needle.

The invention according to an eleventh aspect relates to a method of replacing a defective probe needle with a new probe needle. First, a vertical needle type probe card is prepared which includes a probe needle having upper and lower portions and an intermediate portion connecting them, and an upper guide plate having a first through hole and supporting the upper portion of the probe needle by passing the upper portion through the first through hole, a lower guide plate provided under the upper guide plate, having a second through hole and supporting the lower portion of the probe needle by passing the lower portion through the first through hole, a conductive rubber sheet provided on the upper guide plate, and a printed wiring board provided on the conductive rubber sheet, wherein the upper and lower guide plates are spaced apart by a prescribed distance to expose the intermediate portion of the probe needle, and the upper and lower guide plates are displaced in a first horizontal direction to curve the intermediate portion of the probe needle. The conductive rubber sheet and the printed wiring board are removed from the upper guide plate. The lower guide plate is moved in an opposite direction from the first horizontal direction so as to vertically align the first and second through holes. A defective probe needle is removed and a new probe needle is inserted instead. The upper and lower guide plates are displaced in the first horizontal direction so as to curve the intermediate portion of the probe needle. The conductive rubber sheet and the printed wiring board are returned on the upper guide plate.

The invention according to a twelfth aspect relates to a test method of a wafer using the probe cards.

A vertical needle type probe card is prepared which includes: a probe needle having an upper portion, a lower portion, and an intermediate portion connecting the upper and lower portions; an upper guide plate supporting the upper portion of the probe needle by passing the upper portion therethrough; a lower guide plate provided under the upper guide plate and supporting the lower portion of the probe needle by passing the lower portion therethrough; a conductive rubber sheet provided on the upper guide plate; a printed wiring board provided on the conductive rubber sheet; and a conductive path provided in conductive rubber sheet for electrically connecting the upper portion of the probe needle and the printed wiring board and transferring an electric signal from an IC to a tester. The probe needle is pressed against a surface of a wafer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A vertical needle type probe card which facilitates provision of the structures such as 4×4, 4×8 and n (at least 4)×m and which can be manufactured easily and at low cost, as well as a method of manufacturing the vertical needle type probe card will be described below with reference to the drawings.

First Embodiment

Figure 1:
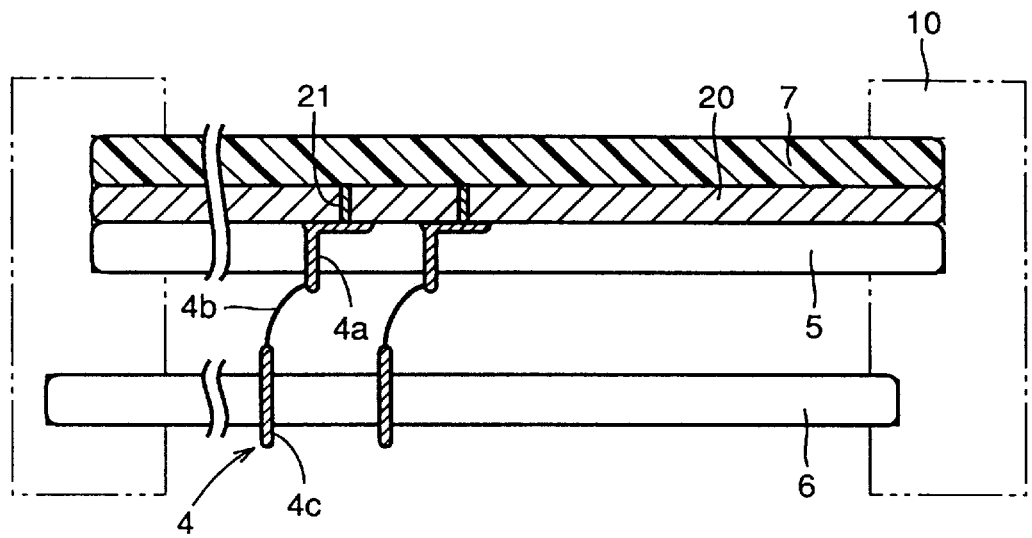
FIG. 1 is a cross sectional view of a vertical needle type probe card according to the present invention.
Figure 27:
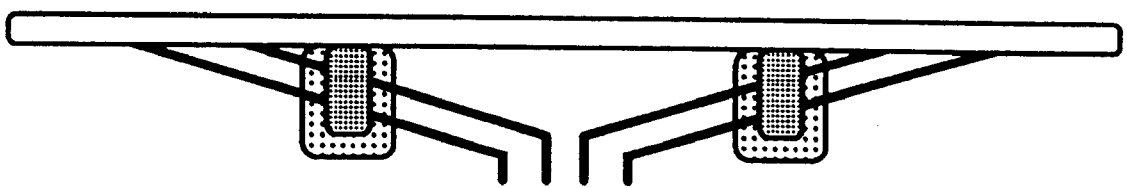
FIG. 27 shows a cross sectional view of a conventional cantilever type probe card having a 4×4 structure.
Figure 28:
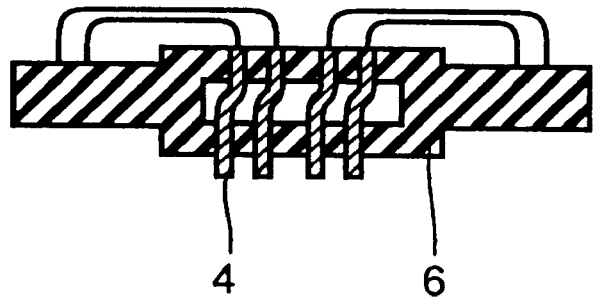
FIG. 28 is a cross sectional view of a conventional vertical needle type probe card.

FIG. 1 is a cross sectional view of a vertical needle type probe card according to a first embodiment, showing probe needles in the third and fourth rows of the right half of the 4×4 structure shown in FIG. 27.

Referring to FIG. 1, probe needle 4 includes an upper portion 4a, a lower portion 4c, and an intermediate portion 4b connecting them. Upper portion 4a of probe needle 4 penetrates an upper guide plate 5. As described below, upper guide plate 5 prevents the rotation of probe needle 4 and fixes probe needle 4. Lower portion 4c of probe needle 4 penetrates a lower guide plate 6. Lower guide plate 6 positions probe needle 4 to bring the tip of probe needle 4 in contact with a pad. These two types of upper guide plate 5 and lower guide plate 6 are formed of the same silicon compound as an IC chip wafer. For example, they are formed of silicon nitride $Si_3N_4$ and mica-based ceramics at which fine pores are easily formed.

A conductive rubber sheet 20 is provided on upper guide plate 5. For example, conductive rubber sheet 20 is Shinetsu Interconnector® MT type from Shinetsu Polymer Company. This is formed by arranging and burying a gold plated metal wiring to high density in soft silicon rubber. The conductive rubber sheet causes electrical conduction due to pressure from above and below. As another conductive rubber sheet, Micro Rubber Probe® from Japan Synthetic Rubber Company may be used. It causes electrical conduction because the rows of metal particles arranged in the silicon rubber sheet in the thickness direction are connected by pressure applied from above and below. A conductive path 21 formed in conductive rubber sheet 20 electrically connects part of probe needle 4 to a land formed at printed wiring board 7. A flat cable or a coaxial cable, not shown, is provided on printed wiring board 7. The flat cable or coaxial cable functions to transfer a signal. Printed wiring board 7, conductive rubber sheet 20, upper guide plate 5 and lower guide plate 6 are firmly fixed by a support member 10.

Probe needle 4 is pressed against the IC pad on the wafer. The electric signal obtained from the tip of the probe needle which is in contact with the pad is transferred through conductive rubber sheet 20 and printed wiring board 7 to the tester so as to perform the wafer test of the IC.

According to the vertical needle type probe card of the embodiment, the probe needle is compact as in the case of a conventional vertical needle, so that the probe needles can be arranged to high density and in a lattice. Therefore, the n×m structure can easily be attained. Since lower guide plate 6 which positions probe needle 4 is formed of the same silicon compound as the IC chip wafer, precise alignment is ensured in every temperature environment.

The function and operation of parts constituting the vertical needle type probe card according to the embodiment will be described in more detail with reference to the drawings.

Figure 2A:
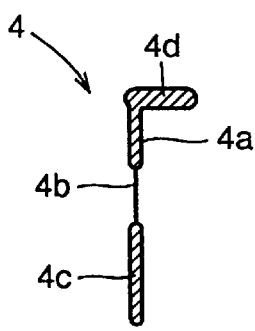
FIGS. 2A and 2B are views for describing in detail a probe needle used for the vertical needle type probe card according to the present invention.
Figure 2B:
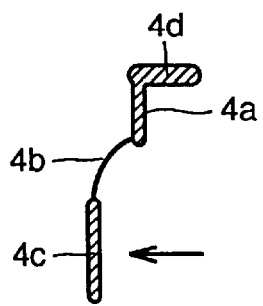

FIGS. 2A and 2B are views for describing a vertical needle in the probe card according to the embodiment. Referring to FIG. 2A, probe needle 4 includes upper portion 4a, lower portion 4c, and intermediate portion 4b connecting them. Upper portion 4a of probe needle 4 is bent at approximately 90°, and it has a stopper portion 4d which is a horizontal portion allowing easy contact with one end of the conductive path formed in the conductive rubber sheet described below. Intermediate portion 4b has a prescribed length, and it is thinner than upper portion 4a and lower portion 4c.

Figure 3:
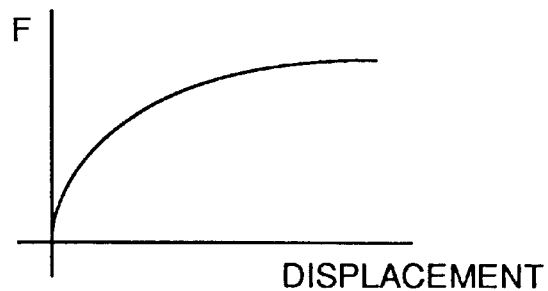
FIG. 3 shows the relationship between the needle pressure and the displacement of the vertical needle type probe card according to the present invention.

Referring to FIG. 2B, intermediate portion 4b is curved as shown in the drawing when a force from the lateral direction is applied to lower portion 4c of probe needle 4. The relationship between a force applied from immediately under probe needle 4, that is, the needle pressure (F) at the time of contact and the distance of the probe needle movement (displacement) into the vertical direction is represented by a saturation curve as shown in FIG. 3. Therefore, considering that the characteristic shown in FIG. 3 is obtained, the spring characteristic of the probe needle is preferably determined to obtain necessary needle pressure by properly reducing the distance between the probe card and the pad.

Preferably, the material of the probe needle is beryllium copper, for example. The tip of the probe needle is formed by gradually tapering the probe needle from the upper part (about 80 $\mu m\phi$) to the lower part (about 30 $\mu m\phi$) through electrolytic grinding or etching using nitric acid.

The cross section of intermediate portion 4b which is finer (i.e. thinner) than other portions may be of a circular or rectangular shape. However, the rectangular shape is preferred to provide curving in a prescribed direction and avoid contact with an adjacent probe needle.

The tip of the probe needle is preferably metal plated in order to obtain high conductivity, abrasion resistance, antiabrasion and so on. It is also preferable coat intermediate portion 4b with Teflon so as to obtain insulation. Stopper portion 4d is provided with optimum plating to allow easy electric contact with the conductive rubber sheet.

Figure 4:
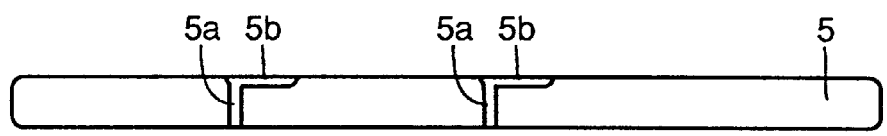
FIG. 4 is a cross sectional view of an upper guide plate used for the vertical needle type probe card according to the present invention.
Figure 5:
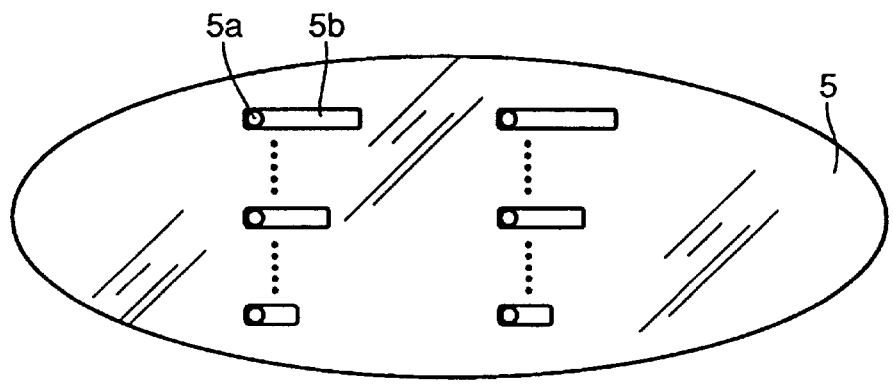
FIG. 5 is a plan view of the upper guide plate.

FIG. 4 is a cross sectional view of the upper guide plate used for the vertical needle type probe card according to the embodiment. FIG. 5 is a plan view of the upper guide plate. In FIG. 5, the upper guide plate is represented as an oval shape for convenience of the drawing. However, it actually has a circular shape. Upper guide plate 5 has a hole 5a (about 90 $\mu m\phi$) for passing the probe needle therethrough. At the surface of upper guide plate 5, groove 5b is provided which is connected to hole 5a and in which stopper portion 4d of the probe needle is partly buried. Groove 5b is formed by precise processing to prevent the rotation of the probe needle and position the probe needle. Upper guide plate 5 is formed of the silicon compound material. The numbers of holes 5a and grooves 5b are the same as those of the pads and the probe needles. Usually, hole 5a and groove 5b are formed by ultrasonic processing.

Figure 6:
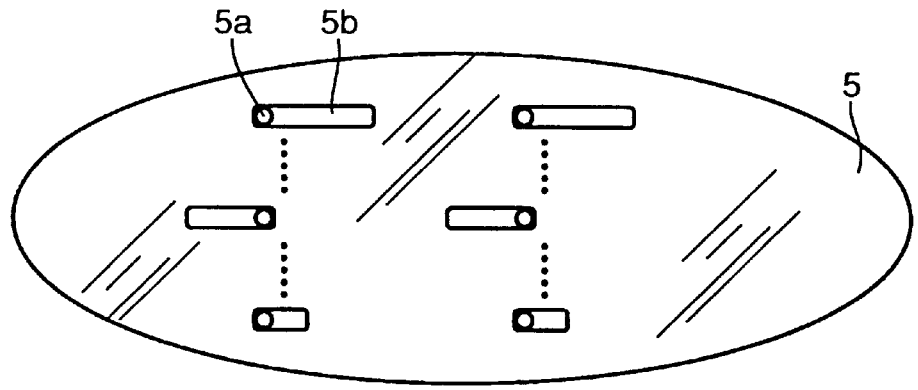
FIG. 6 is a plan view showing another embodiment of the upper guide plate.

Referring to FIG. 6, grooves 5b may be formed so that adjacent grooves are away from each other.

Figure 7:
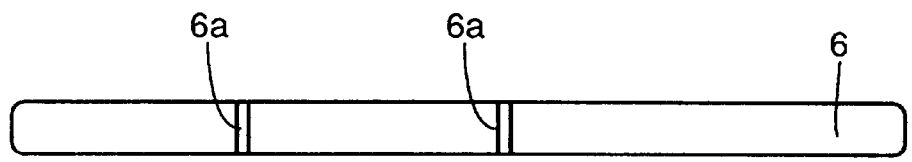
FIG. 7 is a cross sectional view of a lower guide plate.
Figure 8:
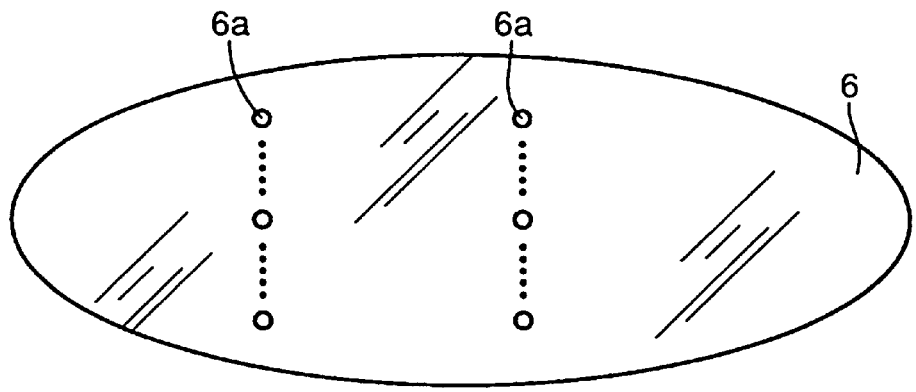
FIG. 8 is a plan view of the lower guide plate.

FIG. 7 is a cross sectional view of the lower guide plate and FIG. 8 is a plan view thereof. In FIG. 8 as well, an oval shape represents the planar shape of the lower guide plate. However, the guide plate actually has a circular shape. Referring to these drawings, lower guide plate 6 is provided with a hole 6a (about 40 $\mu m\phi$) for passing the probe needle therethrough. Lower guide plate 6 is formed of silicon compound. The number of holes 6a is the same as those of the pads and the probe needles. Hole 6a is usually formed by ultrasonic processing.

Second Embodiment

A method of manufacturing the vertical needle type probe card according to the first embodiment will be described below.

Figure 9:
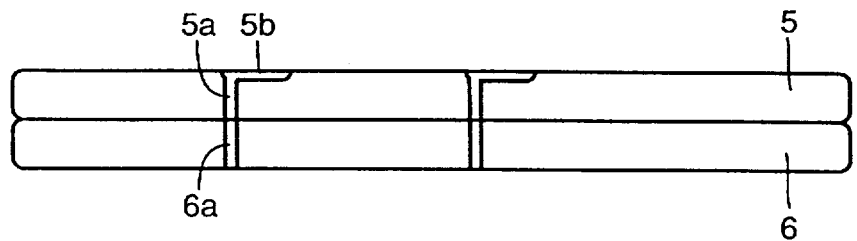
FIGS. 9 to 12 show first to fourth steps of a method of manufacturing the vertical needle type probe card according to the present invention.

Referring to FIG. 9, upper guide plate 5 is placed on lower guide plate 6 so as to align holes 5a and 6a. Since upper guide plate and lower guide plate 6 are both formed of the same silicon compound material as the IC chip wafer, alignment of the centers of all holes is ensured at every temperature.

Figure 10:
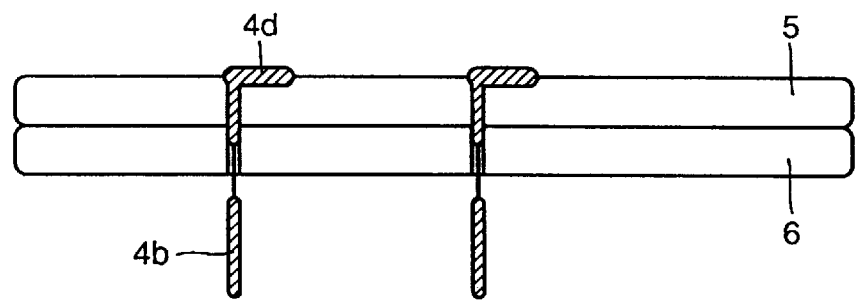

Referring to FIGS. 9 and 10, probe needle 4 is introduced to holes 5a and 6a and inserted into the holes until horizontal stopper portion 4d is fit into groove 5b which is provided at the surface of upper guide plate 5. Since upper guide plate 5 and lower guide plate 6 are formed of the same silicon compound material as the IC chip wafer, the centers of the holes can be aligned precisely in every temperature environment. Although holes 5a are arranged at an interval of about 100 $\mu m$, probe needle 4 is not mistakenly inserted into an adjacent hole, resulting in quick operation. Although the probe needle can be inserted by hand, robotic operation is preferred for mass production.

Figure 11:
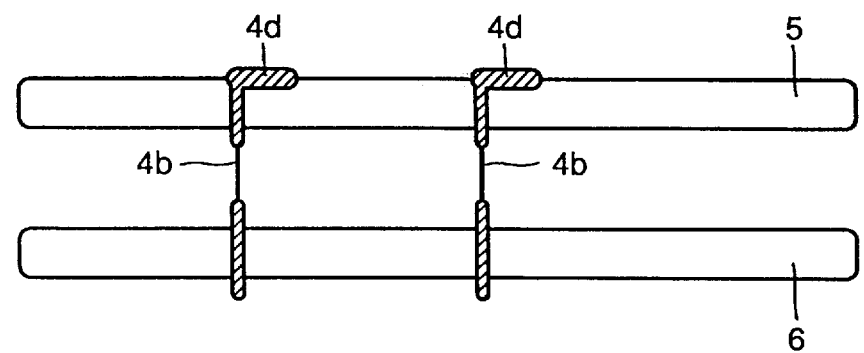

Referring to FIG. 11, upper guide plate 5 and lower guide plate 6 are separated while they are kept parallel with each other to expose intermediate portion 4b of probe needle 4.

Figure 12:
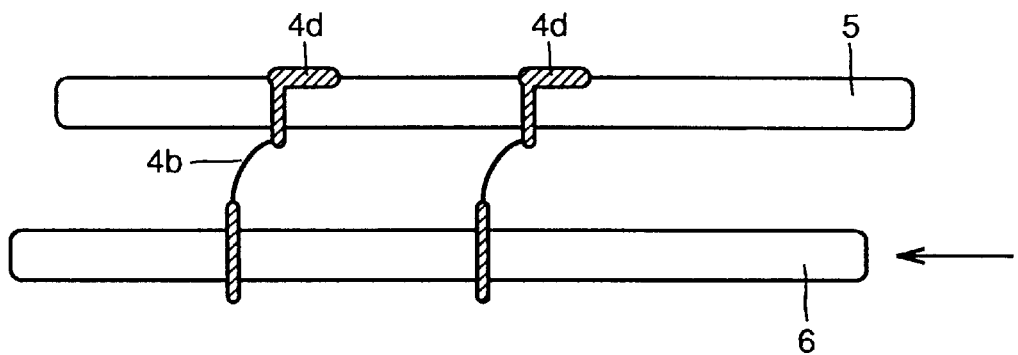

Referring to FIG. 12, lower guide plate 6 is displaced, with respect to upper guide plate 5, in an opposite direction from the direction in which stopper portion 4d of the probe needle extends, so that intermediate portion 4b of probe needle 4 is curved. By curving intermediate portion 4b of probe needle 4, the characteristic shown in FIG. 3 is obtained, and a probe card is obtained which allows necessary needle pressure even if variation of probe needle 4 in the height direction is larger to some extent. This series of operation can easily be realized by an assembly apparatus of high precision. Thereafter, as described below, the conductive rubber sheet and the printed wiring board are provided on the upper guide plate, and the printed wiring board, the conductive rubber sheet, the upper and lower guide plates are firmly fixed by the support member.

Figure 13:
FIG. 13 is a cross sectional view of a printed wiring board used for the vertical needle type probe card according to the present invention.
Figure 14:
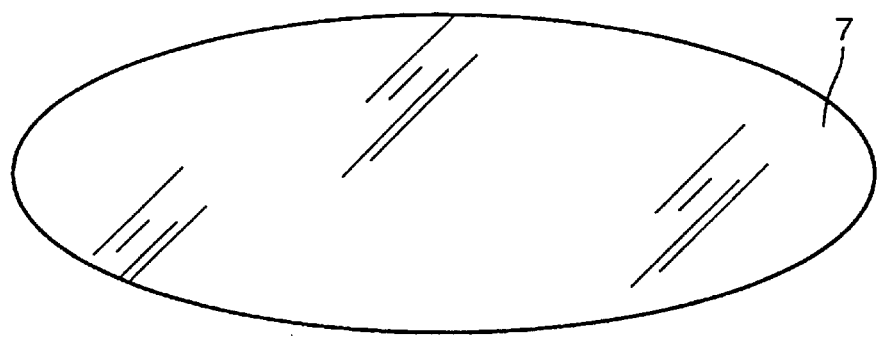
FIG. 14 is a plan view of the printed wiring board.

FIG. 13 is a cross sectional view of the printed wiring board used in the embodiment. FIG. 14 is a plan view of the printed wiring board. In FIG. 14, an oval shape represents the planar shape for convenience of the drawing. However, the printed wiring board actually has a circular shape.

Figure 15:
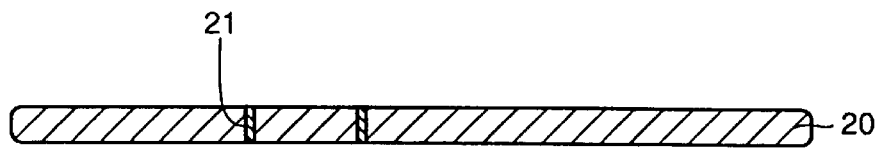
FIG. 15 is a cross sectional view of a conductive rubber sheet used for the vertical needle type probe card according to the present invention.
Figure 16:
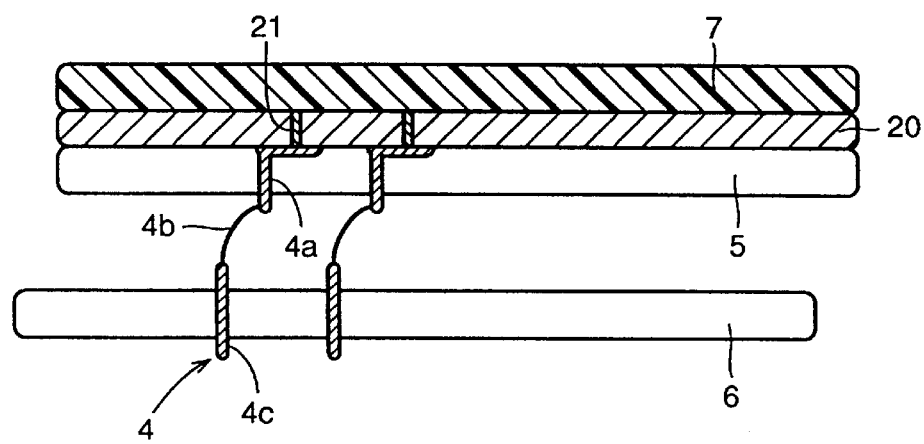
FIG. 16 shows the finished state of the vertical needle type probe card according to the present invention.

FIG. 15 is a cross sectional view of the conductive rubber sheet used in the embodiment. As shown in the drawing, a conductive path 21 is formed by compressing the conductive rubber sheet from above and below. Referring to FIG. 16, conductive rubber sheet 20 is placed on upper guide plate 5, and printed wiring board 7 is placed on conductive rubber sheet 20.

Figure 17:
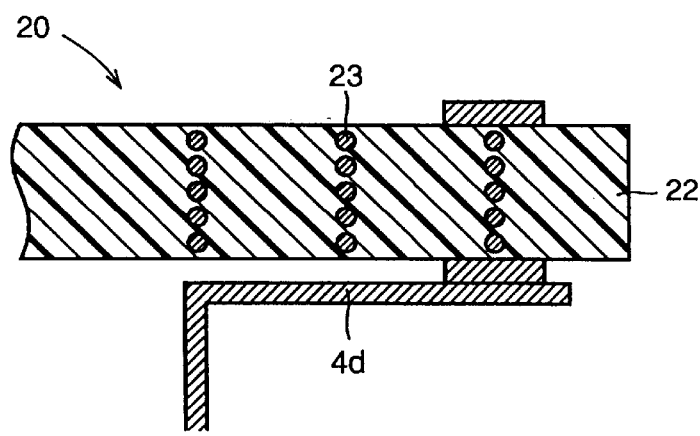
FIG. 17 is a view for describing functions and effects of the conductive rubber sheet used for the present invention.

FIG. 17 is a view for describing the function of the conductive rubber sheet. Conductive rubber sheet 20 has a silicon rubber layer 22. In silicon rubber layer 22, metal particles 23 are buried side by side in the thickness direction of silicon rubber. When silicon rubber layer 22 is compressed from above and below, metal particles 23 come in contact with one another and an electrically conductive path is formed.

Figure 18:
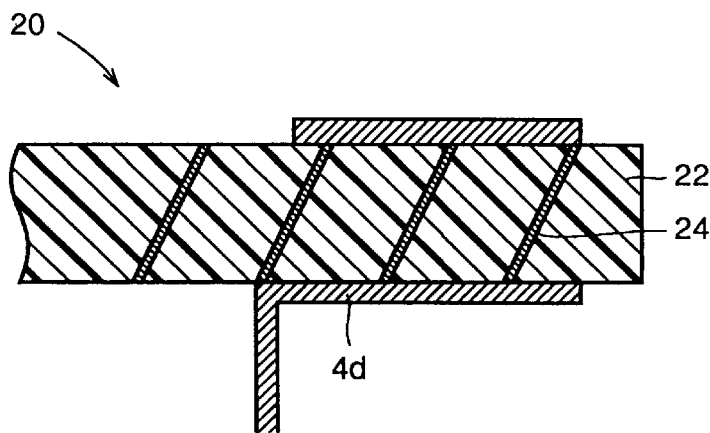
FIG. 18 is a view for describing functions and effects of another example of the conductive rubber sheet used for the present invention.

FIG. 18 shows another example of the conductive rubber sheet. Conductive rubber sheet 20 includes silicon rubber layer 22. In silicon rubber layer 22, a wire 24 is buried in the thickness direction. When silicon rubber layer 22 is compressed from above and below, wire 24 becomes an electrically conductive path.

Referring again to FIG. 16, printed wiring board 7, conductive rubber sheet 20, upper guide plate 5 and lower guide plate 6 are firmly fixed by the support member, and thus the probe card is completed.

Third Embodiment

Figure 19:
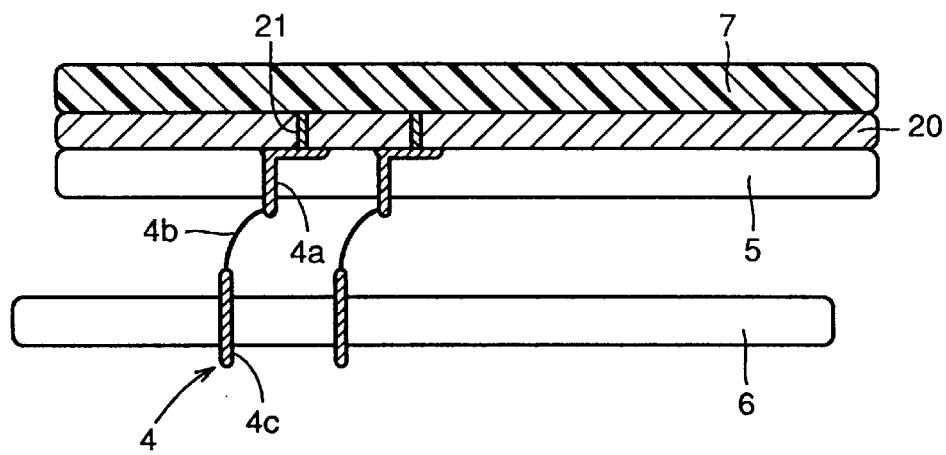
FIGS. 19 to 23 show first to fifth steps of a method of replacing a defective needle according to the present invention.

A third embodiment relates to a method of replacing a defective probe needle, which could not be achieved by a conventional probe card. Referring to FIG. 19, the vertical needle type probe card according to the first embodiment is prepared.

Figure 20:
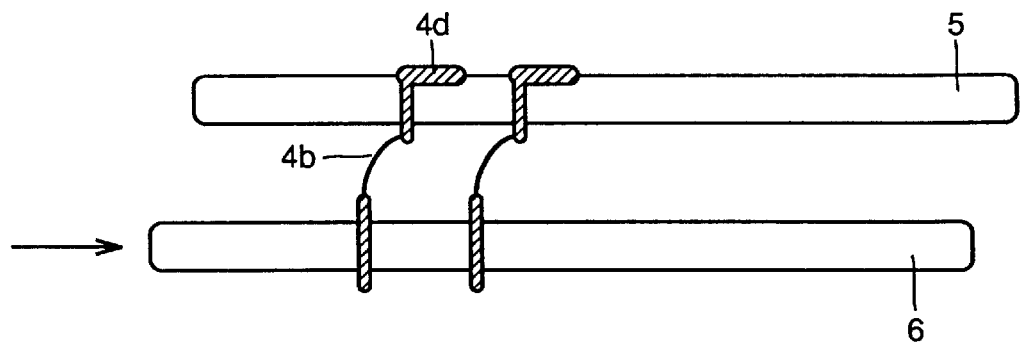
Figure 21:
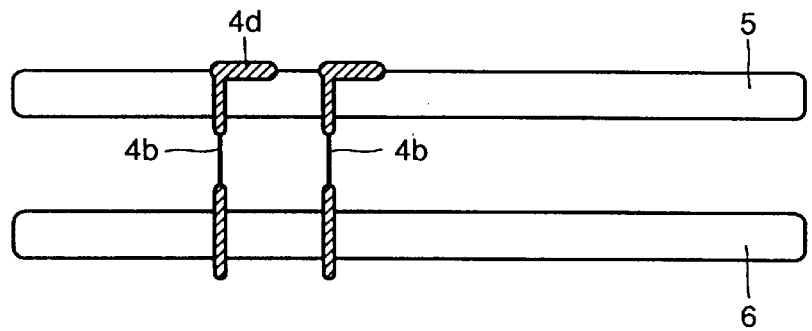

Referring to FIGS. 19 and 20, printed wiring board 7 and conductive rubber sheet 20 are removed from upper guide plate 5. Referring to FIGS. 20 and 21, lower guide plate 6 which has been displaced in the horizontal direction is returned to its original position, and the through hole provided in upper guide plate 5 and the through hole provided in lower guide plate 6 are aligned vertically.

Figure 22:
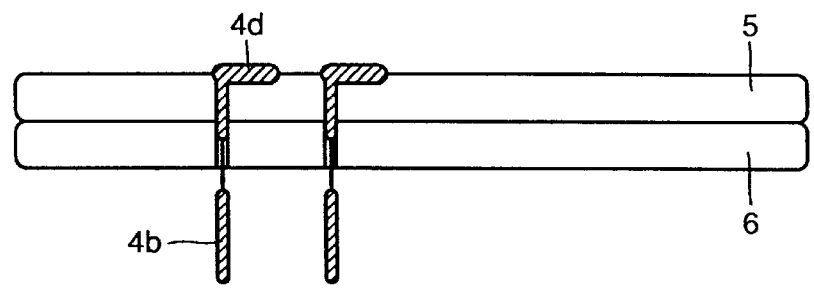
Figure 23:
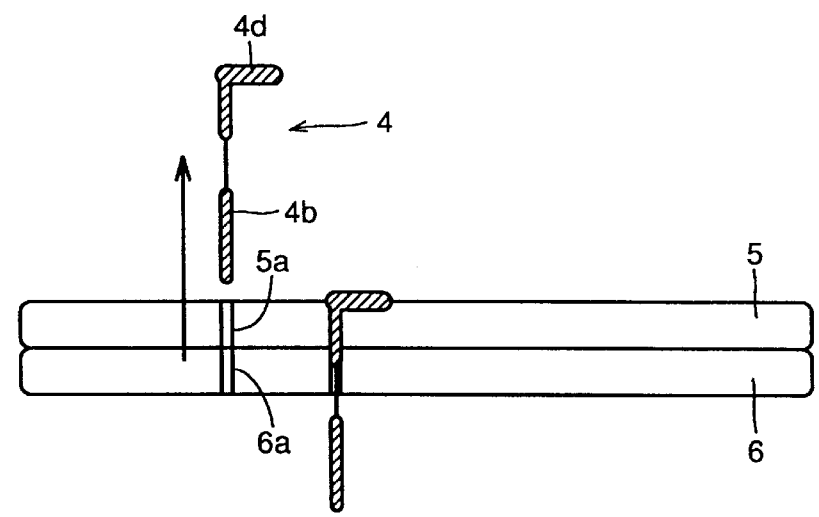
Figure 24:
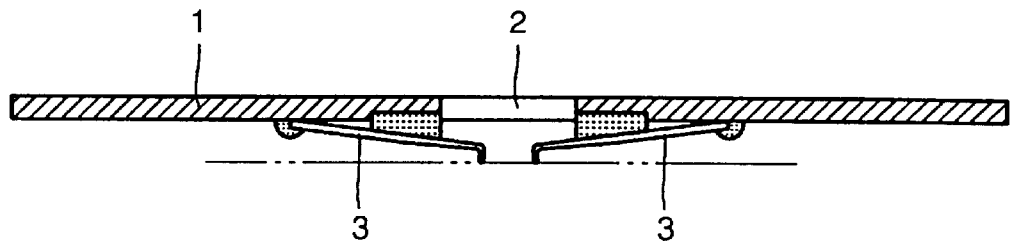
FIG. 24 is a cross sectional view of a conventional cantilever type probe card.
Figure 25:
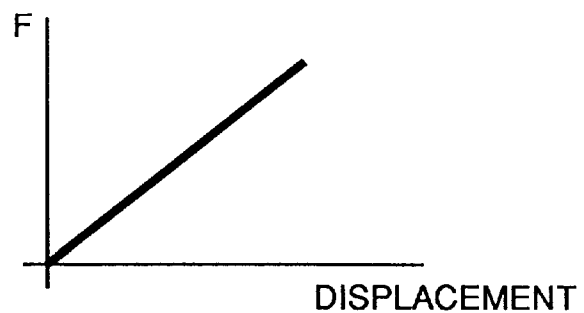
FIG. 25 shows the relationship between the displacement and the needle pressure of the vertical needle of the cantilever type probe card.
Figure 26:
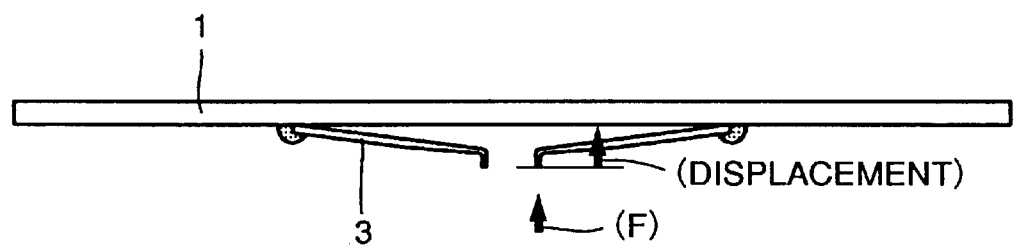
FIG. 26 shows the directions of the needle pressure and the displacement of the cantilever type probe card.

Referring to FIG. 22, lower guide plate 6 is lifted to close the gap between upper guide plate 5 and lower guide plate 6. Referring to FIGS. 22 and 23, defective probe needle 4 is removed and a new probe needle is inserted instead. Thereafter, although it is not shown, the upper and lower guide plates are separated by a prescribed distance to expose the intermediate portion of the probe needle. The upper and lower guide plates are displaced in the first horizontal direction to curve the intermediate portion of the probe needle. On the upper guide plate, the conductive rubber sheet and the printed wiring board are returned to their original positions. Then, the printed wiring board, the conductive rubber sheet, the upper and lower guide plates are firmly fixed by the support member, and thus replacement of the defective probe needle is completed.

As described above, in the embodiment of the present invention, the probe needles can easily be replaced on a needle basis, so that maintenance cost is low and best probe needles are always used. Therefore, the wafer test has fewer contact failures and an superior yield.

Further, a vertical needle type probe card which facilitates provision of the structures such as 4×4, 4×8 and n (at least 4)×m can be manufactured easily and at low cost. Since reduction in the test time and test cost is allowed, cheap ICs can be provided to users.

In the embodiment, lower guide plate 6 is moved in a opposite direction from a direction in which stopper portion 4d extends, as shown in FIG. 12. However, the present invention is not limited to it, but the direction of movement may be the same direction in which stopper portion 4d extends or it may be other directions.

In the embodiment, the cross section of the intermediate portion of the probe needle is of a rectangular shape. However, the present invention is not limited to it, but the entire probe needle may be formed of a plate-like material and bent in other directions than the prescribed direction.

As described above, according to the vertical needle type probe card of the first aspect, the upper guide plate and the printed wiring board are electrically connected by the conductive rubber sheet, so that the conductive rubber sheet and the printed wiring board can easily be removed from the upper guide plate. Therefore, a defective probe needle can easily be replaced.

According to the vertical needle type probe card of the second aspect, the intermediate portion of the probe needle is finer than the upper and lower portions, so that the intermediate portion can easily be curved.

According to the vertical needle type probe card of the third aspect, the cross section of the intermediate portion of the probe needle is curved in a prescribed direction, so that contact with an adjacent probe needle can be prevented.

According to the vertical needle type probe card of the fourth aspect, the probe needle is formed by bending a plate-like member, so that it can be curved only in a prescribed direction. Therefore, contact with an adjacent probe needle can be prevented.

According to the vertical needle type probe card of the fifth aspect, the upper guide plate is provided with a groove in which the horizontal portion of the probe needle is fit and fixed, so that the probe needle is firmly fixed.

According to the vertical needle type probe card of the sixth aspect, the intermediate portion of the probe needle is curved, so that necessary needle pressure is obtained even if variation of the probe needles in the height direction is larger to some extent.

According to the vertical needle type probe card of the seventh aspect, one end of the conductive path is in contact with the surface of the horizontal portion of the probe needle, so that an electric signal obtained by the probe needle is transferred through this path to the tester.

According to the vertical needle type probe card of the eighth aspect, the upper and lower guide plates are formed of the same material as a wafer formed of an IC chip to be wafer-tested, so that the probe needle can precisely be positioned and inserted into the center of the hole in every temperature environment.

According to the vertical needle type probe card of the ninth aspect, the upper and lower guide plates are formed of mica-based ceramics having superior processability, so that the probe needle can be aligned to the center of the hole in every temperature environment.

According to the method of manufacturing the vertical needle type probe card of the tenth aspect, the vertical needle type probe card which facilitates provision of the structures such as 4×4, 4×8 and n (at least 4)×m can be manufactured easily and at low cost.

According to the method of replacing a defective probe needle of the eleventh aspect, a defective probe needle can easily be replaced for every needle, so that maintenance cost is low and best probe needles can always be used. Therefore, the wafer test with fewer contact failures and a superior yield is ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A vertical needle type probe card transferring an electric signal from an IC to a tester by bringing a lower portion of a probe needle vertically in contact with an IC pad, comprising:

a probe needle having an upper portion, said lower portion, and an intermediate portion connecting the upper and lower portions, wherein said probe needle is formed by bending a thin material layer, whose thickness is small compared to the lateral dimensions, with a length large compared to a lateral dimension; and wherein a spring characteristic of said probe needle has a predetermined saturation curve;

an upper guide plate supporting said upper portion of said probe needle by passing the upper portion therethrough;

a lower guide plate provided under said upper guide plate and supporting said lower portion of said probe needle by passing the lower portion therethrough;

a conductive rubber sheet provided on said upper guide plate;

a printed wiring board provided on said conductive rubber sheet; and a conductive path provided in said conductive rubber sheet for electrically connecting said upper portion of said probe needle and said printed wiring board and transferring the electric signal from the IC to the tester.

2. The vertical needle type probe card according to claim 1, wherein said intermediate portion of said probe needle is finer than said upper portion and said lower portion, and said upper portion of said probe needle is bent into an L shape to have a vertical portion and a horizontal portion.

3. The vertical needle type probe card according to claim 1, wherein said intermediate portion of said probe needle has a rectangular sectional shape.

4. The vertical needle type probe card according to claim 2, wherein said upper guide plate has a hole for passing said upper portion of said probe needle therethrough, and a groove provided at the surface of said upper guide plate to be connected to said hole for fixing said horizontal portion of said probe needle which is fit in said groove.

5. The vertical needle type probe card according to claim 1, wherein said upper guide plate and said lower guide plate are spaced apart by a prescribed distance to expose said intermediate portion of said probe needle, and said upper guide plate and said lower guide plate are horizontally displaced to curve said intermediate portion of said probe needle.

6. The vertical needle type probe card according to claim 2, one end of said conductive path is in contact with a surface of said horizontal portion of said probe needle.

7. The vertical needle type probe card according to claim 1, wherein said upper guide plate and said lower guide plate are formed of same material as a wafer on which an IC chip to be wafer-tested is formed.

8. The vertical needle type probe card according to claim 1, wherein said upper guide plate and said lower guide plate are formed of mica-based ceramics having superior processability.

9. A method of manufacturing a vertical needle type probe card transferring an electric signal from an IC to a tester by bringing a lower portion of a probe needle vertically in contact with an IC pad, comprising the steps of:

preparing a probe needle having an upper portion, said lower portion and an intermediate portion connecting the upper and lower portions, said upper portion being bent into an L shape to have a vertical portion and a horizontal portion, wherein said probe needle is formed by bending a thin material layer, whose thickness is small compared to the lateral dimensions, with a length large compared to a lateral dimension, and wherein a spring characteristic of said probe needle has a predetermined saturation curve;

preparing an upper guide plate having a first through hole for passing said probe needle therethrough and a groove formed at a surface of the upper side plate in which said horizontal portion of said probe needle is fit;

preparing a lower guide plate having a second through hole for passing said probe needle therethrough;

placing said upper guide plate on said lower guide plate to horizontally align said first and second through holes;

inserting said probe needle into said first and second through holes until said horizontal portion is fit in said groove;

separating said upper guide plate and said lower guide plate to expose said intermediate portion of said probe needle;

horizontally displacing said upper guide plate and said lower guide plate to curve said intermediate portion of said probe needle;

forming a conductive rubber sheet on said upper guide plate;

forming a printed wiring board on said conductive rubber sheet; and compressing said conductive rubber sheet by said upper guide plate and said printed wiring board so that, in the conductive rubber sheet, a conductive path is formed having one end connective to said printed wiring board and another end electrically connected to said horizontal portion of said probe needle.

10. A method of replacing a defective probe needle to a new probe needle, comprising the steps of:

(a) preparing a vertical needle type probe card including a probe needle having upper and lower portions and an intermediate portion connecting the upper and lower portions, wherein said probe needle is formed by bending a thin material layer, whose thickness is small compared to the lateral dimensions, with a length large compared to a lateral dimension, and wherein a spring characteristic of said probe needle has a predetermined saturation curve;

an upper guide plate having a first through hole and supporting said upper portion of said probe needle by passing the upper portion through the first through hole, a lower guide plate provided under said upper guide plate, having a second through hole and supporting said lower portion of said probe needle by passing the lower portion through said second through hole, a conductive rubber sheet provided on said upper guide plate, and a printed wiring board provided on said conductive rubber sheet, said upper guide plate and said lower guide plate being spaced apart by a prescribed distance to expose said intermediate portion of said probe needle, and said upper guide plate and said lower guide plate being spaced apart by a prescribed distance to expose said intermediate portion of said probe needle, and said upper guide plate and said lower guide plate being displaced in a first horizontal direction to curve said intermediate portion of said probe needle;

(b) removing said conductive rubber sheet and said printed wiring board from said upper guide plate;

(c) moving said lower guide plate in an opposite direction from said first horizontal direction to vertically align said first and second through holes;

(d) moving at least one of said upper guide plate and said lower guide plate so as to close a gap between the upper and lower guide plates;

(e) removing a defective probe needle and inserting a new probe needle;

(f) separating said upper guide plate and said lower guide plate by a prescribed distance to expose said intermediate portion of said probe needle;

(g) horizontally displacing said upper guide plate and said lower guide plate in said first horizontal direction to curve the intermediate portion of the probe needle; and (h) returning said conductive rubber sheet and said printed wiring board on said upper guide plate.

11. A test method of a wafer using a vertical needle type probe card, comprising the steps of:

preparing a vertical needle type probe card including:

a probe needle having an upper portion, a lower portion, and an intermediate portion connecting the upper and lower portions, wherein said probe needle is formed by bending a thin material layer, whose thickness is small compared to the lateral dimensions, with a length large compared to a lateral dimension and wherein a spring characteristic of said probe needle has a predetermined saturation curve;

an upper guide plate supporting said upper portion of said probe needle by passing the upper portion therethrough, a lower guide plate provided under said upper guide plate and supporting said lower portion of said probe needle by passing the lower portion therethrough, a conductive rubber sheet provided on said upper guide plate, a printed wiring board provided on said conductive rubber sheet, and a conductive path provided in said conductive rubber sheet for electrically connecting said upper portion of said probe needle and said printed wiring board and transferring the electric signal from an IC to a tester; and pressing said probe needle against a surface of a wafer.

* * * * *